(12) United States Patent
Lu et al.

(10) Patent No.: US 9,842,903 B2
(45) Date of Patent: Dec. 12, 2017

(54) INTEGRATED CIRCUITS WITH LATERALLY DIFFUSED METAL OXIDE SEMICONDUCTOR STRUCTURES AND METHODS FOR FABRICATING THE SAME

(71) Applicant: GLOBALFOUNDRIES Singapore Pte. Ltd., Singapore (SG)

(72) Inventors: Yi Lu, Singapore (SG); Dongli Wang, Singapore (SG); Deyan Chen, Hubei (CN); Purakh Raj Verma, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 363 days.

(21) Appl. No.: 14/518,786

(22) Filed: Oct. 20, 2014

(65) Prior Publication Data

US 2016/0111488 A1    Apr. 21, 2016

(51) Int. Cl.

| | |
|---|---|
| H01L 29/06 | (2006.01) |
| H01L 29/423 | (2006.01) |
| H01L 29/78 | (2006.01) |
| H01L 29/66 | (2006.01) |
| H01L 21/762 | (2006.01) |
| H01L 29/10 | (2006.01) |

(52) U.S. Cl.
CPC .... *H01L 29/4236* (2013.01); *H01L 21/76229* (2013.01); *H01L 21/76232* (2013.01); *H01L 29/66704* (2013.01); *H01L 29/7825* (2013.01); *H01L 29/0653* (2013.01); *H01L 29/1087* (2013.01); *H01L 29/42368* (2013.01)

(58) Field of Classification Search
CPC ......... H01L 21/76229; H01L 21/76232; H01L 29/0653; H01L 29/1087; H01L 29/4236; H01L 29/42368; H01L 29/66704; H01L 29/7825

See application file for complete search history.

(56) References Cited

U.S. PATENT DOCUMENTS

| | | | | |
|---|---|---|---|---|
| 2006/0006462 A1* | 1/2006 | Chang | ............... | H01L 21/76229 257/341 |
| 2006/0220144 A1* | 10/2006 | Anezaki | ............ | H01L 21/76227 257/374 |
| 2009/0166736 A1* | 7/2009 | Park | .................... | H01L 29/4236 257/343 |
| 2014/0042527 A1* | 2/2014 | Lee | ..................... | H01L 29/4236 257/330 |

* cited by examiner

*Primary Examiner* — Whitney T Moore
*Assistant Examiner* — Joseph Galvin, III
(74) *Attorney, Agent, or Firm* — Lorenz & Kopf, LLP (57) ABSTRACT

Integrated circuits with improved laterally diffused metal oxide semiconductor (LDMOS) structures, and methods of fabricating the same, are provided. An exemplary LDMOS integrated circuit includes an n-type reduced surface field, a p-type body well disposed on a lateral side of the n-type reduced surface field region, a shallow trench isolation structure disposed within the n-type reduced surface field region, and a gate structure disposed partially over the p-type body well, partially over the n-type reduced surface field region, partially over the shallow trench isolation structure, and partially within the shallow trench isolation structure.

15 Claims, 7 Drawing Sheets

INTEGRATED CIRCUITS WITH LATERALLY DIFFUSED METAL OXIDE SEMICONDUCTOR STRUCTURES AND METHODS FOR FABRICATING THE SAME

TECHNICAL FIELD

The technical field generally relates to integrated circuits and methods for fabricating integrated circuits, and more particularly relates to laterally diffused metal oxide semiconductor (LDMOS) integrated circuit structures and methods for fabricating the same.

BACKGROUND

The majority of present day integrated circuits are implemented by using a plurality of interconnected field effect transistors (FETs), also called metal oxide semiconductor field effect transistors (MOSFETs), or simply MOS transistors. A MOS transistor includes a gate electrode as a control electrode and spaced apart source and drain regions between which a current can flow. A control voltage applied to the gate electrode controls the flow of current through an underlying channel between the source and drain regions.

Power MOS devices, including lateral diffused MOS (LDMOS) devices, are employed in a wide variety of applications, such as, for example, power amplifiers in wireless communications systems. LDMOS devices are generally characterized by the use of an epitaxial silicon layer on a more highly doped silicon substrate. While useful in many applications, LDMOS devices are not without drawbacks. For example, "hot carrier injection" (HCI) degradation can significantly limit the performance of these devices. As is well known in the art, the HCI phenomenon generally results from heating and subsequent injection of charge carriers into the gate oxide and/or an oxide layer above a drift region of an LDMOS device. This injection of charge carriers often results in a localized and non-uniform buildup of interface states and oxide charges near and underneath a gate and/or in the drift region of the device. For example, HCI can produce variations in certain characteristics of the LDMOS device, including saturation current, threshold voltage, transconductance, on-resistance, etc., thus undesirably affecting the performance and reliability of the device. The amount of HCI degradation in the device can be measured as a function of the amount of increase in the on-resistance of the device (on-resistance degradation) and/or the amount of decrease in the saturation current (saturation current degradation) in the device.

A conventional LDMOS device typically includes a lightly-doped drain (LDD) region which is often formed at or near an upper surface interface between the epitaxial silicon layer and the gate oxide of the device. Locating the LDD region in close relative proximity to the silicon/oxide interface, however, significantly increases the likelihood that charged carriers will become trapped at the interface, thereby increasing HCI degradation in the device.

In many applications, such as, for example, power amplifier applications, it is desirable to minimize the on-resistance associated with the device. In an LDMOS device, the on-resistance is dominated primarily by the characteristics of the LDD region, thus a known methodology for reducing the on-resistance increases a doping concentration of the LDD region. However, since the LDD region is typically formed at the silicon/oxide interface of the device, as previously stated, increasing the doping concentration of the LDD region also undesirably increases HCI degradation in the device. The increase in HCI degradation resulting from the increased doping concentration of the LDD region often significantly undermines any beneficial reduction in on-resistance that may otherwise be achieved by increasing the doping concentration of the LDD region. Furthermore, by increasing the doping concentration of the LDD region in the device, the breakdown voltage of the device is undesirably reduced.

Accordingly, it is desirable to provide improved LDMOS devices capable of controlling HCI degradation that do not suffer from one or more of the problems exhibited by conventional LDMOS devices. Moreover, it is desirable to provide such improved LDMOS devices that are compatible with existing integrated circuit (IC) fabrication process technologies. In addition, it is desirable to provide methods for fabricating such LDMOS devices. Furthermore, other desirable features and characteristics will become apparent from the subsequent detailed description and the appended claims, taken in conjunction with the accompanying drawings and this background of the invention.

BRIEF SUMMARY

Integrated circuits with improved laterally diffused metal oxide semiconductor (LDMOS) structures, and methods for fabricating the same, are provided. In one embodiment, an exemplary LDMOS integrated circuit includes an n-type reduced surface field region, a p-type body well disposed on a lateral side of the n-type reduced surface field region, a shallow trench isolation structure disposed within the n-type reduced surface field region, and a gate structure disposed partially over the p-type body well, partially over the n-type reduced surface field region, partially over the shallow trench isolation structure, and partially within the n-type reduced surface field region.

In another exemplary embodiment, a method for forming an LDMOS integrated circuit includes forming an n-type reduced surface field region and a p-type body well in a semiconductor substrate, wherein the p-type body well is disposed on a lateral side of the n-type reduced surface field region, forming a first trench within the n-type reduced surface field region, and forming a shallow trench isolation structure within the trench. The method further includes forming a second trench within the shallow trench isolation structure and forming a gate structure over the n-type reduced surface field region, over the p-type body well, over the shallow trench isolation structure, and within the second trench.

In yet another exemplary embodiment, an LDMOS integrated circuit structure includes a p-type semiconductor substrate, an n-type deep well region disposed over and in contact with the p-type semiconductor substrate, an n-type reduced surface field region disposed over and in contact with the n-type deep well region, and a p-type body well disposed on a lateral side of the n-type reduced surface field region. The integrated circuit further includes a shallow trench isolation structure disposed within the n-type reduced surface field region and a gate structure disposed partially over the p-type body well, partially over the n-type reduced surface field region, partially over the shallow trench isolation structure, and partially within the shallow trench isolation structure. The shallow trench isolation structure includes first and second silicon oxide layers separated by the at least one silicon nitride layer. The gate structure extends into the shallow isolation trench structure below an upper surface defined by the p-type body well and the n-type reduced surface field region. Further, the gate structure extends into the shallow trench isolation structure through the second silicon oxide layer to contact with the silicon nitride layer, but does not extend through the silicon nitride layer.

BRIEF DESCRIPTION OF THE DRAWINGS

The various embodiments will hereinafter be described in conjunction with the following drawing figures, wherein like numerals denote like elements, and wherein.

DETAILED DESCRIPTION

The following detailed description is merely exemplary in nature and is not intended to limit the various embodiments or the application and uses thereof. Furthermore, there is no intention to be bound by any theory presented in the preceding background or the following detailed description.

Various embodiments of LDMOS integrated circuits, and method for fabricating the same, are described herein. The described embodiments utilize an extended gate region within the shallow isolation trench structure located under the transistor gate electrode, in contrast with the conventional approach of using a shallow trench isolation structure with no gate extension therein, as will be described in greater detail below. The described embodiments reduce the impact of the HCI phenomenon, thereby allowing the LDMOS integrated circuits to be operated at more desirable voltage and current levels. Further, the described embodiments reduce fabrications cost and complexities for LDMOS integrated circuits by requiring at least two fewer processing steps, as also will be described in greater detail below.

For the sake of brevity, conventional techniques related to integrated circuit device fabrication may not be described in detail herein. Moreover, the various tasks and process steps described herein may be incorporated into a more comprehensive procedure or process having additional steps or functionality not described in detail herein. In particular, various steps in the manufacture of semiconductor-based transistors are well-known and so, in the interest of brevity, many conventional steps will only be mentioned briefly herein or will be omitted entirely without providing the well-known process details.

As used herein, it will be understood that when an element or layer is referred to as being "on," "connected to" or "coupled to" another element or layer, it may be directly on, connected to, or coupled to the other element or layer, or intervening elements or layers may be present. Further, spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass either an orientation of above or below. The device may be otherwise oriented (rotated 90 degrees or at other orientations) and the spatially relative descriptors used herein may likewise be interpreted accordingly.

Figure 1:
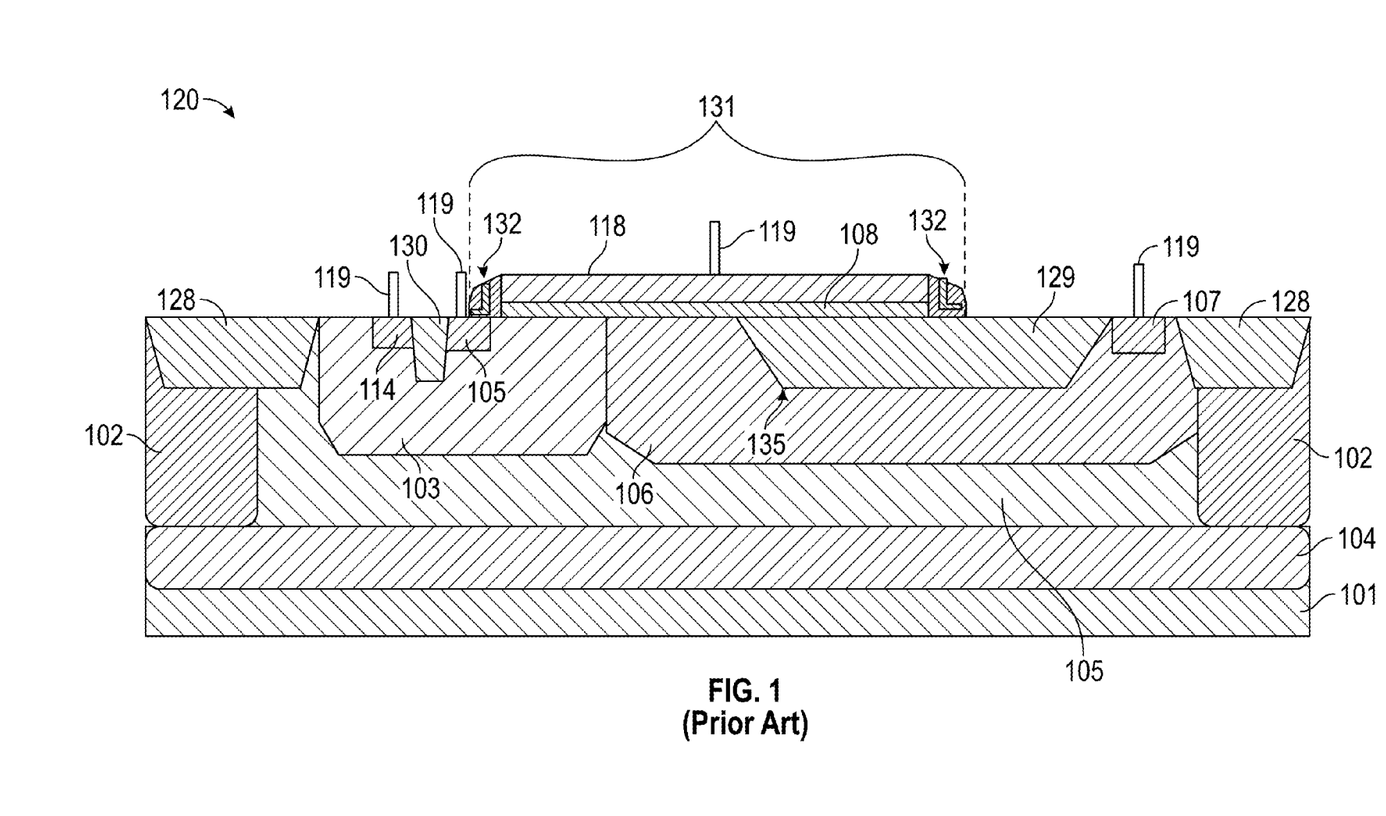
FIG. 1 is a cross-sectional view of a conventional LDMOS transistor of the prior art.

To more fully appreciate the benefits of the described embodiments, a brief description will be initially provided regarding conventional LDMOS integrated circuits. FIG. 1 is a cross-sectional view of a conventional LDMOS transistor 120, provided for purposes of comparison with the embodiments of the present disclosure. Conventional LDMOS transistor 120 includes a P– substrate 101 (as conventionally used in the art, the symbols "–" and "+" will be used to denote light doping and heavy doping, respectively, in connection with the specified "N" or "P"-type dopant) and an N+ buried layer 104 formed on the P– substrate 101. A P– epitaxial layer 105 is grown on N+ buried layer 104.

The active region of the LDMOS transistor 120 is defined between n-well regions 102 having shallow trench isolation (STI) structures 128 formed thereover. The active region of LDMOS transistor 120 is the region on P– epitaxial layer 105 where LDMOS transistor 120 is being fabricated or formed. The active region includes a P-well 103 in which an N+ source region 105A is formed. P-well 103 can be formed through ion implantation or diffusion of any p-type element such as boron. Similarly, the source region 105A can also be formed through ion implantation or diffusion of any n-type element such as arsenic.

The active region of the LDMOS transistor 120 also includes an n-type reduced surface field region 106 (which may also be formed using a suitable ion implantation process with an n-type ion) having a shallow trench isolation structure 129 formed thereover. STI structure 129 is formed within the action regions between STIs 128. Adjacent to STI structure 129 is an N+ drain region 107. Similar arsenic implantation can be used to form drain region 107 of LDMOS transistor 120.

Further, LDMOS transistor 120 includes a gate structure 131 that includes, for example, a polycrystalline silicon ("polysilicon") gate electrode 118 that is partially over n-type reduced surface field region 106 (including partially over STI structure 129) and partially over P-well 103. As shown in FIG. 1, gate structure 131 is isolated from n-type reduced surface field region 106 and P-well 103 by a thin dielectric layer 108, which can be, for example, a thin silicon oxide ($SiO_2$) layer. Further, on the sidewalls of gate structure 131, spacers 132 are formed. These spacers are non-conductive in nature and can be formed by using dielectric material such as silicon oxide ($SiO_2$) or nitride. Contacts 119 may be formed to the source 105A, the drain 107, and the gate electrode 118. A contact may also be formed to a P+ body contact area 114, which is located over the P-well 103 and separated from the source 105A by an STI structure 130.

Figure 2:
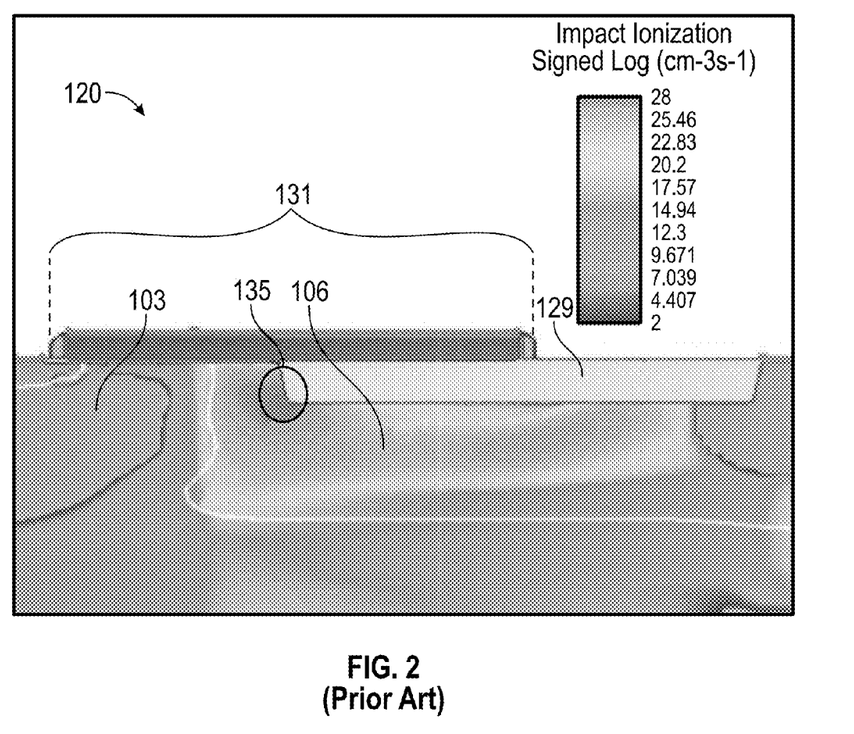
FIG. 2 is an illustration of the electric field generated during the operation of the conventional LDMOS transistor shown in FIG. 1.

In conventional LDMOS devices such as the one shown in FIG. 1, the sharp corners (reference numeral 135) typical of STI structure 129 locally increases the electric field at those corners, which results in rapid hot carrier degradation and lower breakdown voltage within LDMOS transistor 120. Current flowing through LDMOS transistor 120 is forced to bypass the STI structure 129, thereby resulting in a relatively high on-resistance. That is, the current flowing through LDMOS transistor 120 must flow deep within the silicon, along the relatively long path that exists under STI structure 129. FIG. 2 is illustrative of this current flow. As shown therein, a locally strong electric field exists at the sharp corner region 135 of STI structure 129. Further, the electric field is relatively strong underneath the STI structure 129 due to the deep flowing current in n-type region 106. This strong electric field, as noted above, causes the HCI phenomenon. The HCI phenomenon, in turn, causes the reduced device performance. That is, increasing gate voltage beyond a certain level, depending on design parameters, causes reduced substrate current flow, due to increasing resistance.

Figure 3:
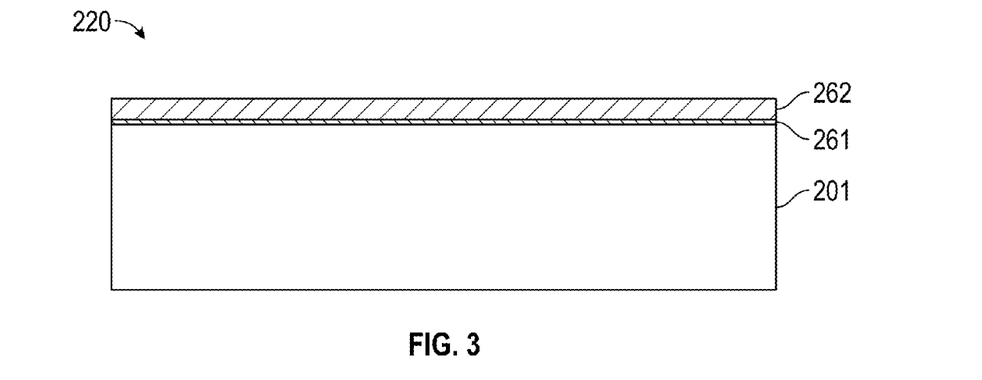
FIGS. 3-10 are a cross-sectional views of LDMOS transistors and methods for fabricating LDMOS transistors in accordance with various embodiments of the present disclosure.

In order to address at least the foregoing deficiencies of the prior art, an illustrative embodiment of the present disclosure is provided in connection with FIGS. 3-10. FIGS. 3-10 are cross-sectional views of a transistor 220 in accordance with various embodiments. With particular reference to FIG. 3, LDMOS transistor 220 is fabricated using a p-type semiconductor substrate 201. P-type semiconductor substrate 201 can be, for example, a p-type monocrystalline silicon substrate. P-type semiconductor region 201 may alternately be an epitaxially grown p-type silicon layer or a p-type silicon-on-insulator (SOI) region. Upon P− substrate 201, a layer of an oxide material 261 is deposited by, for example, low pressure chemical vapor deposition (LPCVD), to a thickness of from about 100 to about 500 Angstroms. This layer 261 is a stress-relief layer and is commonly referred to in the art as a "PAD oxide" layer. A hard mask layer 262 is then formed over the PAD oxide layer 261. The hard mask layer 262 may include a dielectric material, such as silicon nitride, silicon oxynitride, or the like. An exemplary hardmask layer 262 is deposited to a thickness greater than that of the PAD oxide layer 261.

Figure 4:
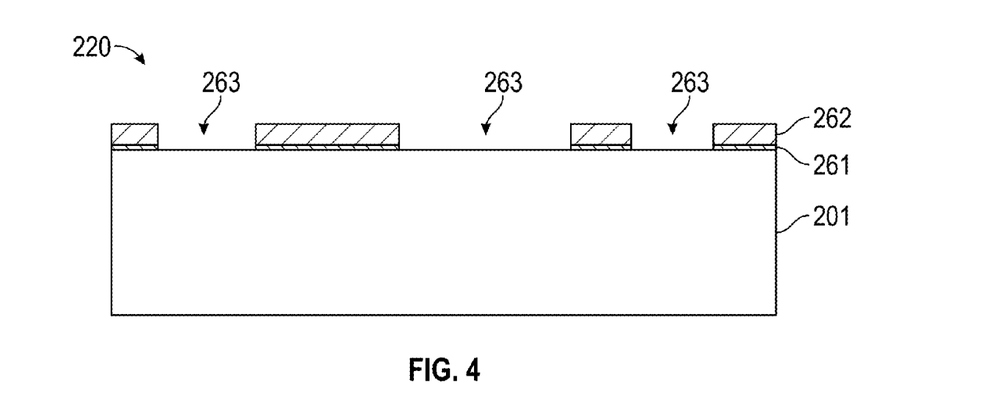

Turning now to FIG. 4, a plurality of first shallow trench isolation (STI) trenches 263 (hereinafter "STI trenches") are formed using a suitable patterning, masking, and etching technique. Shown in FIG. 4 are three trench structures 263. The plurality of first STI trenches 263 are formed through the hard mask layer 262 and through the stress relief PAD oxide layer 261. The substrate 201 is used as an "etch stop" layer, that is, the layer at which the plurality of first STI trenches 263 extend to, but not through. The plurality of first STI trenches 263 may be formed on the basis of any suitable masking and etching process or processes. For example, in one embodiment, a photoresist material (not illustrated) may be deposited over the hard mask layer, which is then patterned by exposure to a light source using known photolithographic processes. One or more etching steps are then performed to transfer the pattern into the hard mask layer 262 and the stress relief layer 261. The remaining portions of the patterned photoresist layer are then removed (for example by a suitable polishing or planarization process), resulting substantially in the structure illustrated in FIG. 4.

Figure 5:
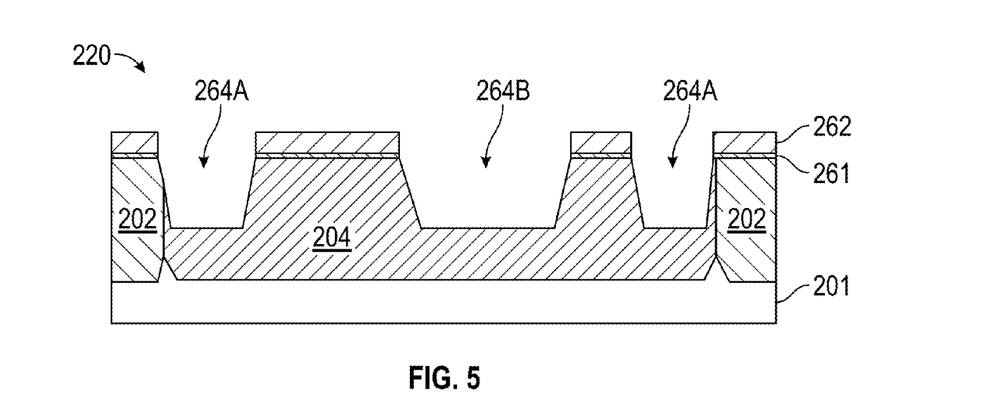

With reference now to FIG. 5, a deep n-well region 204 is formed on the basis of any well-known ion implantation technique. The active region of transistor 220 is defined by p-type isolation wells 202, 204, which are provided on opposite sides of the deep n-well region 204. The p-type isolation wells 202 may also be formed on the basis of any well-known ion implantation technique. For example, regarding the formation of the wells 202, 204, they may be formed using a high-energy implantation process in which the energy of the implantation is typically about 200 keV or greater (such as from about 200 keV to about 1000 keV) and the exemplary dose of dopant is about $10^{13}$ cm$^{-2}$ or greater (such as from about $10^{13}$ cm$^{-2}$ to about $10^{11}$ cm$^{-2}$).

Additionally shown in FIG. 5 is the extension of the STI trenches 263 into the deep n-well region 204. These "extended" STI trenches 264A, 264B may be formed using a suitable etching process that is selective to the silicon material that forms the n-well region 204. Any isotropic or anisotropic etching technique is suitable, and no further masking is required with the remaining portions of layers 261 and 262 serving as a suitable mask for the extension of the STI trenches 264A, 264B. With reference to the three extended STI trenches shown in FIG. 5, two (reference numeral 264A) are provided within the deep n-well region 204 directly adjacent to the p-type isolation wells, and the third (reference numeral 264B) is formed in the deep n-well region between the other two (264A) and spaced apart from the other two (264A).

Figure 6:
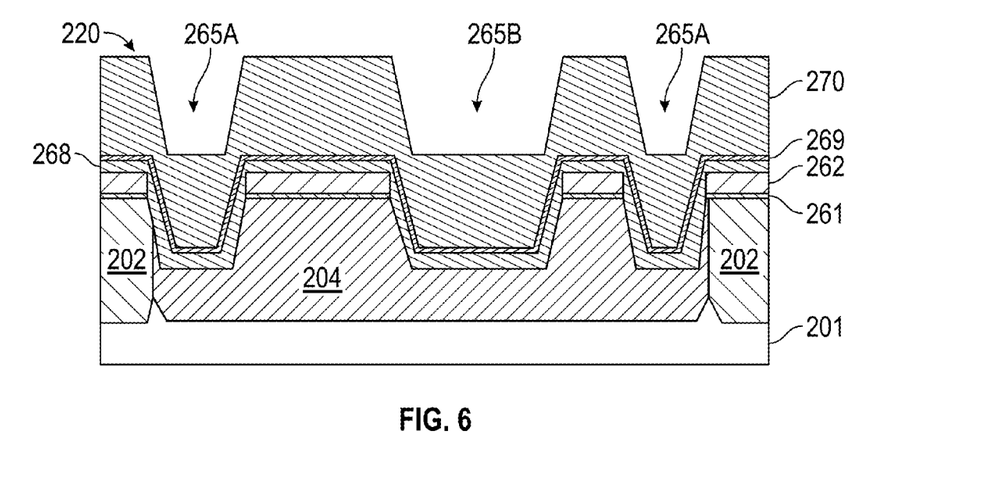

As shown in FIG. 6, in the exemplary embodiment, three additional layers are then deposited over the remaining portions of layers 261 and 262, as well as into the extended STI trenches 264A, 264B. The first such layer to be deposited is a first layer of a silicon-based dielectric film 268, such as silicon oxide, using high-density plasma chemical vapor deposition (HDP CVD) techniques. An exemplary first dielectric film layer 268 is deposited conformally using HDP CVD over the layers 261, 262 and within the extended STI trenches 264A, 264B at a thickness of from about 50 nm to about 200 nm, for example. Thereafter, the second such layer to be deposited is a thin layer of a silicon nitride material 269, which may be deposited using any suitable deposition technique to a thickness of from about 100 to about 500 Angstroms. Thin silicon nitride layer 269 may be deposited conformally over an entirety of the first dielectric film layer 268. Additionally, the third such layer to be deposited is a second layer of the silicon-based dielectric film 270, which again may be deposited using HDP CVD to a thickness of from about 100 nm to about 500 nm. The second dielectric layer 270 may be deposited conformally over an entirety of the thin silicon nitride layer 269. It is noted that with the conformal deposition of each of the three layers 268, 269, and 270, trench-like structures 265A, 265B are "mirrored" or "replicated" in the second dielectric film layer 270 over the location where the extended STI trenches 264A, 264B, respectively, had been previously formed.

Figure 7:
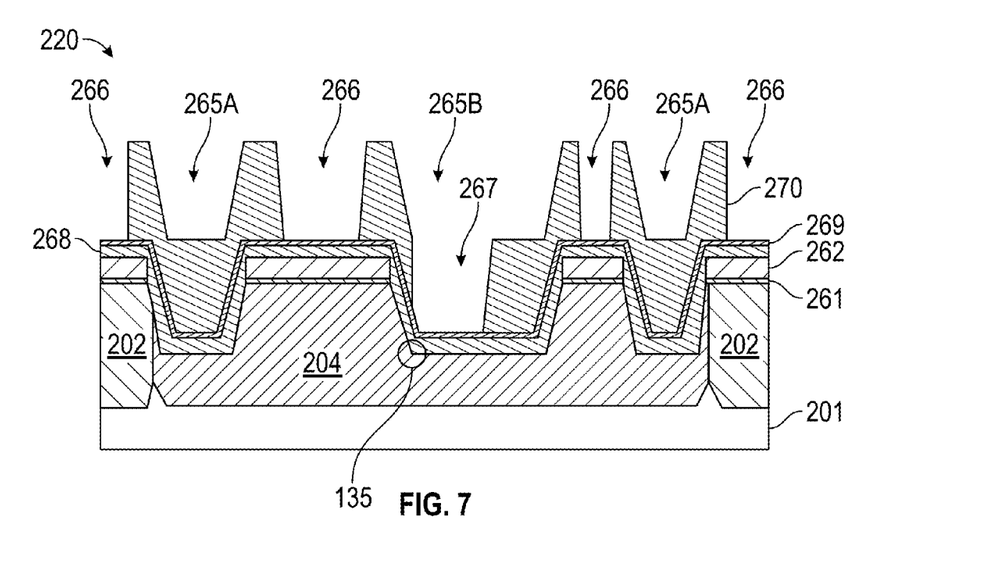

With attention now to FIG. 7, additional trench structures 266 are formed in the second dielectric film layer 270 between the replicated trench structures 265A, 265B. In particular, additional trench structures are formed over the remaining segments of layers 261, 262 between the previously-formed extended trenches 264A, 264B, to expose a portion of silicon nitride layer 269 at the bottom of each such trench 266. In this manner, trenches 266 are formed both over the p-type isolation wells 202 and the deep n-well region 204, and spaced between or adjacent to respective replicated trenches 265A, 265B. The trenches 266 may be formed on the basis of any suitable patterning, masking, and etching process As additionally shown in FIG. 7, a portion of replicated trench 265B is extended into the conformal second dielectric layer 270, stopping at the thin silicon nitride layer 269. This extended portion 267 may be formed on the basis of any suitable patterning, masking, and etching process, which may be performed simultaneously with, or separately from, the patterning, masking, and etching process used to formed trenches 266. The extended portion 267 may a have a width (in a direction parallel to the surface of the semiconductor substrate) that is less than the original width of the extended STI trench 265B, such as less than about 75% of such width, or less than 50% of such width, but greater than, for example, about 10% of such width in any case. The extended portion may be positioned proximate to a corner of the STI structure 203B, such as corner 135 as described above with regard to FIG. 1, being separated therefrom by a distance equivalent to the combined thickness of conformal layers 268 and 269 of the STI structure 203B. Whether performed simultaneously or separately, the etching of trenches 266 and trench 267 is performed so as to etch through the second dielectric film layer 270 and stop on the silicon nitride layer 269.

Figure 8:
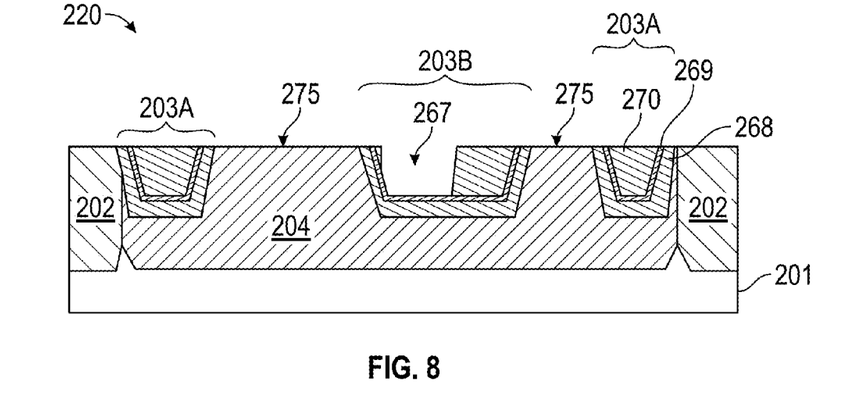

Thereafter, as shown in FIG. 8, a suitable planarization or polishing step may be performed so as to remove portions of layers 268, 269, and 270 that exist above the upper surface of the deep n-well 204 and the p-type isolation regions 202, as well as an entirety of the remaining portion of layers 261 and 262. The remaining structure after such polishing or planarization includes a substantially planar upper surface 275 that includes portions of deep n-well 204, p-type isolation wells 202, as well as portions of layers 268, 269, and 270 that are formed within the former extended STI trenches 264A, 264B. The substantially planar upper surface 275 is discontinuous at the trench 267 which, as noted above, extends into the layer 270 at a portion of the area formerly occupied by extended STI trench 264B. The remaining portions of the layers 268, 269, and 270 that are formed within the area formerly occupied by extended STI trenches 264A form STI structures 203A, and the remaining portions of the layers 268, 269, and 270 that are formed within the area formerly occupied by extended STI trench 264B form STI structure 203B.

Figure 9:
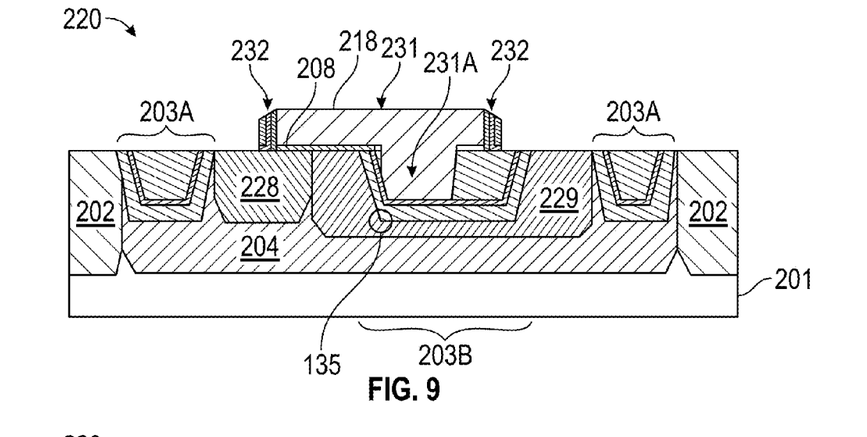

Continuing with the method as shown in FIG. 9, within the active region and deep n-well 204 is further provided a p-type implant layer 228 and an n-type reduced surface field region 229 that is spaced apart from the layer 228 and surrounds the STI structure 203B. To form layers 228 and 229, photolithographic masking layers may be patterned over the areas wherein the layers 228 and 229 are to be formed, and then p-type and n-type conductivity determining ions may be implanted, respectively, using well-known ion implantation techniques. The exemplary p-type implant layer 228 is not in contact with the p-type semiconductor substrate 201. That is, the p-type implant layer 228 is not formed deep enough within the deep n-well region 204 to contact the p-type substrate 201.

As additionally shown in FIG. 9, gate structure 231 is formed partially over the STI structure 203B, partially over the p-type implant layer 228, and also over the portion of the deep n-well region between the p-type implant layer and the STI structure 203B. Gate structure 231 includes a thin dielectric layer 208, a gate electrode 218, and sidewall spacers 232. In order to form the dielectric layer 208, a thermal oxide layer is formed over the semiconductor substrate. The thermal oxide dielectric layer 208 may be formed using conventional oxidation deposition, well-known in the art. The layer 208 may be appropriately patterned by: forming a photoresist mask, performing a dry etch, and then removing the photoresist mask. Thereafter, in order to form the gate electrode 218, any gate-first process, replacement metal gate process, or gate-last process as is known in the art can be used, with the provision of an appropriate conductive material, such as a metal material, a metal-containing material, or a polycrystalline silicon material, for example. Additionally, the sidewall spacers 232 may be formed in a conventional manner by the deposition of an appropriate material(s) over and along the sides of the gate electrode 218, followed by anisotropic etching to the top of the gate electrode 218.

As further shown in FIG. 9, the gate structure 231 includes a portion 231A that extends downward below the gate dielectric layer 208 and into the STI structure 203B. In this portion 231A, the conductive material that forms that gate structure 231 extends into and fully fills the area formerly occupied by extended trench portion 267, and comes into abutting contact with the silicon nitride layer 269 thereof. Regarding an overall depth of the STI structure 203B, the portion 231A extends downward into STI structure 203B greater than about 50% of the overall depth of the STI structure 203B, such as greater than 75% of such depth, for example up to about 95% of such depth. With the STI structure 203B, the gate electrode portion 231A is separated from the n-type reduced surface field region 229 by the silicon nitride 269 and the first dielectric film layer 268, which form the lower layers of the STI structure 203B.

As initially noted, corner areas 135 of the STI structures, particularly STI structure 203B in an LDMOS device, are susceptible to the HCI phenomenon. Accordingly, without wishing to be bound by theory, it is believed that by extending the conductive gate electrode structure 231 downward into the STI structure 203B in portion 231A, which as shown in FIG. 9 may be separated from the corner area 135 only by the thicknesses of conformal silicon nitride layer 269 and conformal first dielectric layer 268, the electrical field produced by the conduction in the portion 231A will act, by its proximity, to reduce the impact ionization and increase the breakdown voltage at the corner area 135. Again, without wishing to be bound by theory, it is believed that an electrical phenomena known as the "enhanced field plate effect" is responsible for the benefits achieved by the LDMOS structure disclosed herein. As is known in the art, the enhanced field plate effect refers to the capacitance created in an area by the application of current to a field plate, which in this case is the gate electrode that extends into the STI structure 203B near the corner 135.

Figure 10:
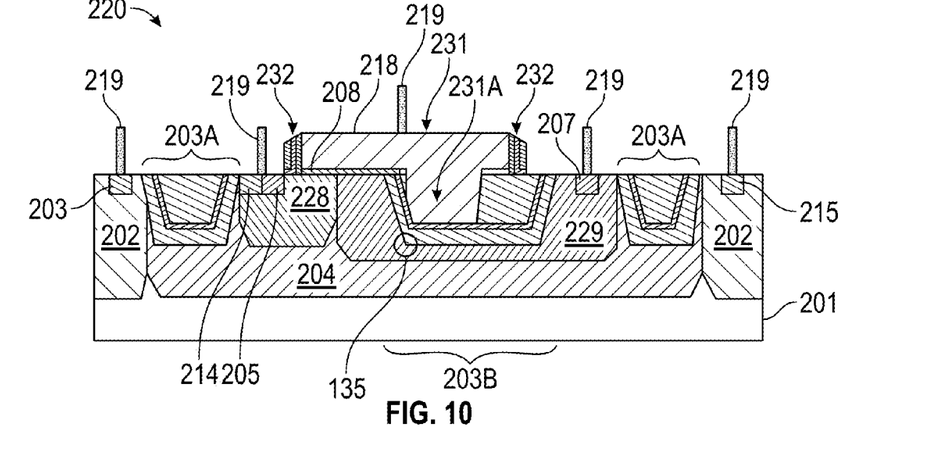

Turning now to FIG. 10, the transistor 220 further includes an N+ source region 205, adjacent to gate structure 231, within the p-type implant layer 228. An N+ drain region 207 is formed within n-type reduced surface field region 229 at an opposite side of STI structure 203B from the p-type implant layer 228. Additionally, p-type contact regions 213 may be formed within the p-type isolation regions 202 that define the active region, as well as a p-type body contact region 204 being formed adjacent to the N+ source region 205. Contact structures 219 are provided to each of the p-type isolation contact regions 213, the body contact region 214, the source region 205, the drain region 207, and the gate electrode 218. All such features may be formed using conventional LDMOS processing techniques, as are known in the art, using conventional materials.

Although not separately illustrated, source/drain extension implants may be performed to create lightly doped source/drain extension regions in LDMOS transistor 220. Additionally, although not separately illustrated, metal salicide regions may be formed at the contact areas. Contacts 219 are formed to the salicided regions to make electrical contact with these contact regions. Contacts 219 may be formed within a (non-illustrated) inter-layer dielectric formed of an insulating material such as a silicon oxide. A standard CMOS process is used to form the remaining backend structures (e.g., metal lines and vias), which are not shown for the sake of clarity.

Figure 11A:
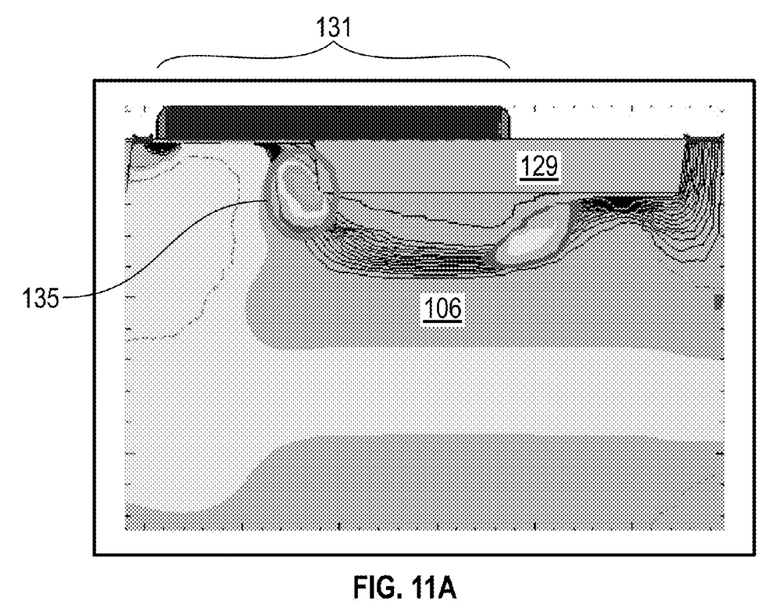
FIGS. 11A and 11B are illustrations of the impact ionization generated during the operation of both the conventional LDMOS transistor shown in FIG. 1 and the LDMOS transistor of the present disclosure shown in FIG. 10, respectively.
Figure 11B:
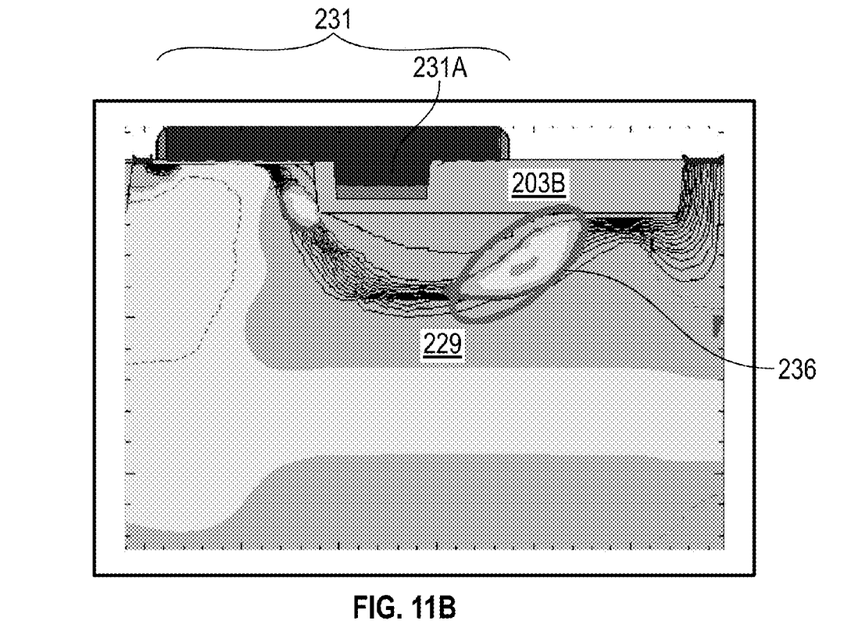

FIGS. 11A and 11B illustrate differences in impact ionization between an LDMOS device as shown in FIG. 1 (FIG. 11A) and an LDMOS device as shown in FIG. 10 (FIG. 11B). With the inclusion of the extension of the gate electrode 218 into area 231A of the STI structure 231A as shown in FIG. 11B, by virtue of the enhance field plate effect, the current flow is "pushed" away from the corner region 135, thus reducing the impact ionization and reducing the HCI phenomenon. As further shown in FIG. 11B, the impact ionization is greatest in an area 236 underneath the STI structure 203B that is far removed from the corner 135, thus improving device performance.

Figure 12A:
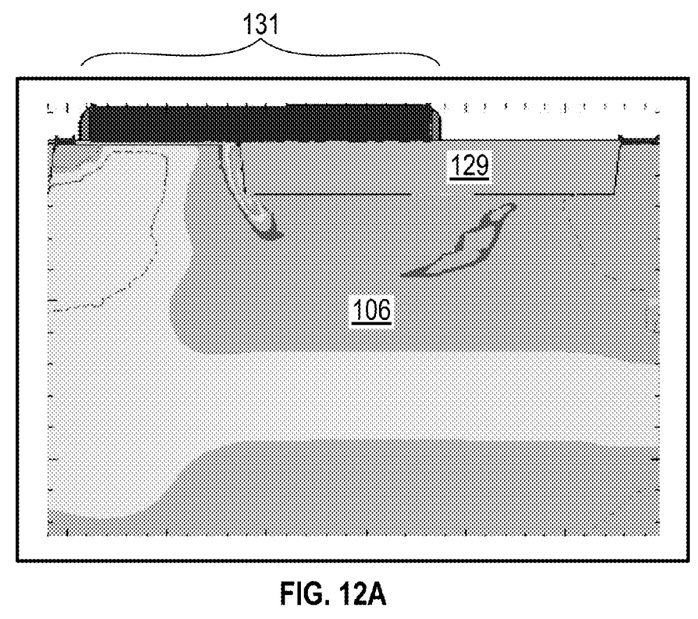
FIGS. 12A and 12B are illustrations of the impact breakdown voltage exhibited during the operation of both the conventional LDMOS transistor shown in FIG. 1 and the LDMOS transistor of the present disclosure shown in FIG. 10, respectively.
Figure 12B:
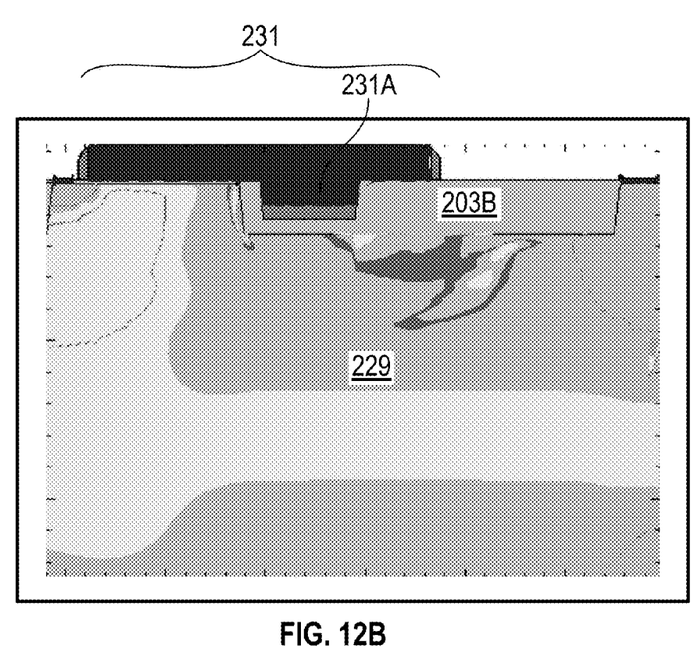

FIGS. 12A and 12B illustrate differences in breakdown voltages between the conventional LDMOS structure of FIG. 1 (FIG. 12A) and the LDMOS structure shown in FIG. 10 in accordance with the present disclosure. As shown in FIG. 12B, the breakdown voltage is significantly increased as a result of the inclusion of the extension of the gate electrode 218 into area 231A of the STI structure 231A, thus improving device performance.

Accordingly, improved LDMOS transistor structures have been described. The LDMOS transistor structures employ an extended gate region within the shallow isolation trench structure located at the LDMOS source side, in contrast with the conventional approach of using a shallow trench isolation structure with no gate electrode extension therein. The described LDMOS transistor structures thus employ the enhanced field plate effect at a corner region of STI structure to "push" current flowing thereby away from the STI structure to reduce impact ionization, and thus reduce the aforementioned detrimental HCI phenomenon, as well as increase the breakdown voltage of the LDMOS device.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration in any way. Rather, the foregoing detailed description will provide those skilled in the art with a convenient road map for implementing an exemplary embodiment. It being understood that various changes may be made in the function and arrangement of elements described in an exemplary embodiment without departing from the scope as set forth in the appended claims.

What is claimed is:

1. A laterally diffused metal oxide semiconductor (LDMOS) integrated circuit structure comprising:
   an n-type reduced surface field region;
   a p-type body well disposed on a lateral side of the n-type reduced surface field region;
   a shallow trench isolation structure disposed within the n-type reduced surface field region, wherein the shallow trench isolation structure comprises first and second silicon oxide layers separated by a silicon nitride layer; and
   a gate structure disposed partially over the p-type body well, partially over the n-type reduced surface field region, partially over the shallow trench isolation structure, and partially within the shallow trench isolation structure, wherein the gate structure extends into the shallow isolation trench structure below an upper surface defined by the p-type body well and the n-type reduced surface field region, and wherein the gate structure extends into the shallow trench isolation structure through the second silicon oxide layer to contact with the silicon nitride layer, but does not extend through the silicon nitride layer.

2. The LDMOS integrated circuit structure of claim 1, wherein the gate structure extends within the shallow trench isolation structure in an area proximate a source side of the shallow trench isolation structure that is adjacent to the p-type body well.

3. The LDMOS integrated circuit structure of claim 1, further comprising an N+ source region disposed within the p-type body well.

4. The LDMOS of integrated circuit structure of claim 1, further comprising an N+ drain region disposed within the n-type reduced surface field region.

5. The LDMOS integrated circuit structure of claim 1, further comprising a P+ body contact region disposed within the p-type body well.

6. The LDMOS integrated circuit structure of claim 1, further comprising an n-type deep well region, wherein the n-type reduced surface field region is disposed over and in contact with the n-type deep well region.

7. The LDMOS integrated circuit structure of claim 6, further comprising a p-type isolation well disposed on a lateral side of the n-type deep well region.

8. The LDMOS integrated circuit structure of claim 7, further comprising a P+ contact region disposed within the p-type isolation well.

9. The LDMOS integrated circuit structure of claim 1, further comprising a second shallow trench isolation structure disposed adjacent to the p-type body well.

10. The LDMOS integrated circuit structure of claim 6, further comprising a p-type semiconductor substrate, wherein the n-type deep well region is disposed over and in contact with the p-type semiconductor substrate.

11. A method for forming an LDMOS integrated circuit comprising:
    forming an n-type reduced surface field region and a p-type body well in a semiconductor substrate, wherein the p-type body well is disposed on a lateral side of the n-type reduced surface field region;
    forming a first trench within the n-type reduced surface field region;
    forming a shallow trench isolation structure within the trench, wherein forming the shallow trench isolation structure comprises depositing a first silicon oxide dielectric layer in the trench, depositing a silicon nitride layer over the first silicon oxide dielectric layer, and depositing a second silicon oxide dielectric layer over the silicon nitride layer;
    forming a second trench within the shallow trench isolation structure; and
    forming a gate structure over the n-type reduced surface field region, over the p-type body well, over the shallow trench isolation structure, and within the second trench, wherein the gate structure is formed so as to extend into the shallow isolation trench structure below an upper surface defined by the p-type body well and the n-type reduced surface field region, and wherein the gate structure is formed so as to extend into the shallow trench isolation structure through the second silicon oxide layer to contact with the silicon nitride layer, but does not extend through the silicon nitride layer.

12. The method of claim 11, wherein forming the second trench comprises etching the shallow trench isolation structure through the second silicon oxide dielectric layer and stopping at the silicon nitride layer.

13. The method of claim 11, wherein forming the second trench comprises etching the shallow trench isolation structure at a source end thereof proximate the p-type body well.

14. The method of claim 11, wherein forming the gate structure comprises depositing a polycrystalline silicon material within the second trench.

15. A laterally diffused metal oxide semiconductor (LDMOS) integrated circuit structure comprising:
- a p-type semiconductor substrate;
- an n-type deep well region disposed over and in contact with the p-type semiconductor substrate;
- an n-type reduced surface field region disposed over and in contact with the n-type deep well region;
- a p-type body well disposed on a lateral side of the n-type reduced surface field region;
- a shallow trench isolation structure disposed within the n-type reduced surface field region; and
- a gate structure disposed partially over the p-type body well, partially over the n-type reduced surface field region, partially over the shallow trench isolation structure, and partially within the shallow trench isolation structure,
- wherein the shallow trench isolation structure comprises first and second silicon oxide layers separated by the at least one silicon nitride layer,
- wherein the gate structure extends into the shallow isolation trench structure below an upper surface defined by the p-type body well and the n-type reduced surface field region, and
- wherein the gate structure extends into the shallow trench isolation structure through the second silicon oxide layer to contact with the silicon nitride layer, but does not extend through the silicon nitride layer.

* * * * *